United States Patent [19]

Dujari et al.

[11] Patent Number: 5,537,421

[45] Date of Patent: Jul. 16, 1996

[54] SINGLE CHIP ERROR PROCESSOR

[75] Inventors: Vineet Dujari, Santa Clara, Calif.; Larry A. Copp, Boise, Id.

[73] Assignee: Advanced Micro Devices, Inc., Sunnyvale, Calif.

[21] Appl. No.: 255,016

[22] Filed: Oct. 7, 1988

[51] Int. Cl.$^6$ ............................. G11B 20/18; G06F 11/10
[52] U.S. Cl. ..................... 371/37.1; 371/38.1; 371/40.1
[58] Field of Search ................................... 371/37.1, 40.1

[56] References Cited

U.S. PATENT DOCUMENTS

| | | | |
|---|---|---|---|
| 4,567,594 | 1/1986 | Deodhar | 371/40.1 |
| 4,649,541 | 3/1987 | Lahmeyer | 371/37.1 |
| 4,763,332 | 8/1988 | Glover | 371/37.1 |
| 4,777,635 | 10/1988 | Glover | 371/40.1 |
| 4,849,929 | 7/1989 | Timsit | 364/900 |
| 4,897,840 | 1/1990 | Veiss et al. | 371/40.1 |
| 5,140,595 | 8/1992 | Geldman et al. | 371/39.1 |

FOREIGN PATENT DOCUMENTS

| | | |
|---|---|---|
| 0156724 | 10/1985 | European Pat. Off. . |
| 0282877 | 9/1988 | European Pat. Off. . |

OTHER PUBLICATIONS

Advanced Micro Devices, *1985 Data Book*, "Am9520/Am9521/AmZ8065 Burst Error Processor", pp. 2–489 through 2–499.

Millman, J. et al., *Microelectronics*, McGraw–Hill, 1987, p. 176.

Laviolette et al., "Programmable, Single–Chip Controller Adapts to Different System Environments" WESCON '86 CONFERENCE RECORD, 18–20 Nov. 1986 Los Angeles, CA pp. 1–7.

*Primary Examiner*—Stephen M. Baker
*Attorney, Agent, or Firm*—Lowe, Price, LeBlanc & Becker

[57] ABSTRACT

An error processor on a single integrated circuit chip to detect and correct errors in a block of received data. The error processor includes processing hardware for receiving data and for generating syndrome bytes corresponding to the received data. It also includes processing hardware for detecting errors in the received data and for generating correction vectors to indicate the relative locations and error values thereof. An interface is connected to the processing hardware for facilitating data transfer to and from a communications bus.

29 Claims, 5 Drawing Sheets

DISK READ OPERATION (WITH ERROR)

SINGLE CHIP ERROR PROCESSOR

BACKGROUND OF THE INVENTION

The present invention relates to an error processor and, more particularly, to a processor disposed on one integrated circuit chip that includes processing hardware and an interface therefor.

In any digital system where data is transmitted and received, one or more of the data bytes may be received in error. This has been a problem from the time data processing systems were first invented.

As more sophisticated data processing operations are performed, involving more complex equipment, there is a greater need for systems to detect and correct errors in data transfers. For example, operations such as merging files, sorting of data within files, numerical/statistical analyses, complex data handling procedures and word processing operations require increased reliability in data transfer. In the field of telecommunications and telemetry, error rates tend to increase when data is transmitted over analog lines at high baud rates. If data errors occur and are undetected, valuable information and system operation itself may be affected. Thus, error detecting and correcting features are not only advantageous, they are required to improve system integrity.

In response to the problem of error generation during data transfers, systems have been developed to detect such errors. One of the earliest methods for detecting errors was the parity check code. A binary code word has odd parity if an odd number of its digits are 1's. For example, the number 1011 has three 1 digits and therefore has odd parity. Similarly, the binary code word 1100 has an even number of 1 digits and therefore has even parity.

A single parity check code is characterized by an additional check bit added to each data word to generate either odd or even parity. An error in a single digit or bit in a data word would be discernible since the parity check bit associated with that data word would then be reversed from what is expected. Typically, a parity generator adds the parity check bit to each word before transmission. This technique is called padding the data word. At the receiver, the digits in the word are tested and if the parity is incorrect, one of the bits in the data word is considered to be in error. When an error is detected at a receiver, a request for a repeat transmission can be given so that the error can be corrected. Only errors in an odd number of digits can be detected with a single parity check, since an even number of errors results in the parity expected for a correct transmission. Moreover, the specific bit in error cannot be identified by the parity check procedure as hereinabove described.

A more sophisticated error detection system was later devised. Data words of a fixed length of bits were grouped into blocks of a fixed number of data words each. Parity checks were then performed between different data words as well as for each individual data word. The block parity code detected many patterns of errors and could be used not only for error detection, but also for error correction when an isolated error occurred in a given row and column of the matrix. While these geometric codes were an improvement over parity check bits per se, they still could not be used to detect errors that were even in number and symmetrical in two dimensions.

After parity check codes and geometric codes were devised, a code was invented by Hamming, after whom it is named. The Hamming code is a system of multiple parity checks that encodes data words in a logical manner so that single errors can be not only detected but also identified for correction. A transmitted data word used in the Hamming code consists of the original data word and parity check digits appended thereto. Each of the required parity checks is performed upon specific bit positions of the transmitted word. The system enables the isolation of an erroneous digit, whether it is in one of the original data word bits or in one of the added parity check bits.

If all the parity check operations are performed successfully, the data word is assumed to be error free. If one or more of the check operations is unsuccessful, however, the single bit in error is uniquely determined by decoding so-called syndrome bits, which are derived from the parity check bits. It should be noted once again that only single bit errors are detected and corrected by use of the conventional Hamming code. Double bit errors, although detectable by the Hamming code, are not correctable.

The Hamming code is only one of a number of codes, generically called error correcting codes (ECC's). Codes are usually described in mathematics as closed sets of values that comprise all the allowed number sequences in the code. In data communications, transmitted numbers are essentially random data patterns which are not related to any predetermined code set. The sequence of data, then, is forced into compliance with the code Set by adding to it at the transmitter, as hereinabove mentioned. A scheme has heretofore been developed to determine what precise extra string to append to the original data stream to make the concatenation of transmitted data a valid code. There is a consistent way of extracting the original data from the code value at the receiver and to deliver the actual data to the location where it is ultimately used. For the code scheme to be effective, it must contain allowed values sufficiently different from one another so that expected errors do not alter an allowed value such that it becomes a different allowed value of the code.

A cyclic redundancy code (CRC) consists of string of binary data evenly divisible by a generator polynomial, which is a selected number that results in a code set of values different enough from one another to achieve a low probability of an undetected error. To determine what to append to the string of original data, the original string is divided as it is being transmitted. When the last data bit is passed, the remainder from the division is the required string that is added since the string including the remainder is evenly divisible by the generator polynomial. Because the generator polynomial is of a known length, the remainder added to the original string is also of fixed length.

At the receiver, the incoming string is divided by the generator polynomial. If the incoming string does not divide without remainder, an error is assumed to have occurred. If the incoming string is divided by the generator polynomial without remainder, the data delivered to the ultimate destination is the incoming data with the fixed length remainder field removed.

The efficiency of error detecting and correcting hardware can be improved by a technique called data interleaving. A block of data being transmitted is partitioned into separate subdivisions and each subdivision is treated as an independent data block for error detection and correction purposes. This makes a large error occurring in the data block appear as a smaller error in a subdivision since it is split between two subdivisions.

Error correcting codes called Reed-Solomon codes are especially effective in byte oriented transmission protocol and are being increasingly used in disk and communications systems.

In previous computer systems, error control related tasks occurred in discrete steps. An operating engine or processor would generate syndromes but the syndromes would have to be evaluated elsewhere. Similarly, when checkbytes were to be generated, they would be generated using a software program. Thus, previous systems have required separate components for performing the various steps in error detection and correction. Because of the multiple components required, additional expense and concomitant time delays were often needed.

In the earliest systems, all error detection and correction activities were performed in software. Later, hardware was available to perform checkbyte and syndrome generation operations, but software was still required to evaluate the syndromes and then to correct the erroneous data. The use of software in these systems is time consuming and inefficient.

It would be advantageous to provide checkbyte and syndrome generator operation in hardware.

It would also be advantageous to provide a hardware engine or processor with an interface on one integrated circuit chip.

It would also be advantageous to provide syndrome analysis in hardware.

It would also be advantageous to provide a mechanism for generating correction vectors when errors are detected and to include this mechanism in an error processor on a single chip.

It would also be advantageous to signal other components that a vector is available so that no polling or interrupt activities need be pursued.

SUMMARY OF THE INVENTION

In accordance with the present invention, there is provided an error processor on a single integrated circuit chip to detect and correct errors in a block of received data. The error processor includes processing hardware for receiving data and for generating syndrome bytes corresponding to the received data. It also includes processing hardware for detecting errors in the received data and for generating correction vectors to indicate the relative locations and error values thereof. An interface is connected to the processing hardware for facilitating data transfer to and from a communications bus.

BRIEF DESCRIPTION OF THE DRAWINGS

A complete understanding of the present invention may be obtained by reference to the accompanying drawings, when taken in conjunction with the detailed description thereof and in which.

DESCRIPTION OF THE PREFERRED EMBODIMENT

In the preferred embodiment, the error processor of the present invention is designed to perform error detection and correction in optical disk systems. The processor implements the ANSI X3B11 standard Reed-Solomon (RS) polynomial and sector data format and interfaces directly with a disk data path controller for optical systems. It should be understood, however, that the present invention is not limited to use with optical disks and may be used in other environments without violating the spirit and scope of this invention. Such other uses include, but are not limited to other parallel data transmission systems where data integrity is required.

In general, present-day optical disk media technology suffers from high error rates (1 bit in 10,000). A read error every other disk sector is typical. The error processor of the present invention reduces this error rate to a level comparable to that of magnetic disks.

The error processor of the present invention supports simultaneous syndrome generation for a disk sector being read and correction vector generation for a sector previously read. This functional simultaneity allows fast error correction of data read from the disk. This feature is extremely critical for optical disk systems where read errors are frequent.

The error processor of the present invention resides on a buffer interface bus alongside a buffer memory and functions as a slave peripheral on this bus and supports a high transfer rate mechanism for disk data transfer operations, as described in greater detail hereinbelow.

Figure 1:
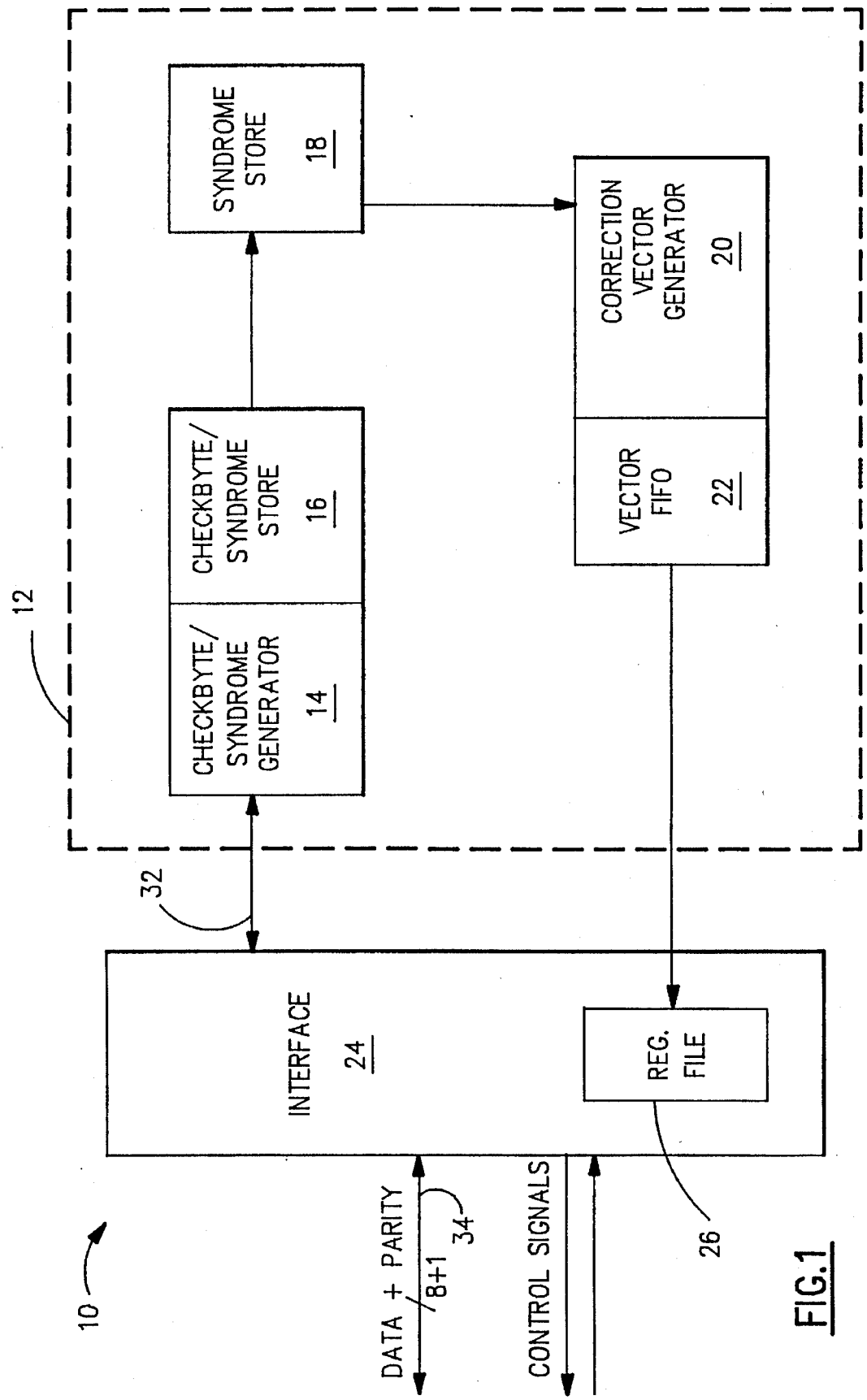
FIG. 1 is a block diagram of the error processor in accordance with the present invention.

Referring now to FIG. 1, there is shown a block diagram of the error processor of the present invention shown generally at reference numeral 10. Shown in phantom is a hardware processor 12 which is included in the inventive error processor. Hardware processor 12 performs a number of functions used in processing error corrections based on the Reed-Solomon algorithm, well known in the art. Processors that have the aforementioned capability are available from Advanced Hardware Architectures Inc. as model number AHA4510 integrated circuit chip.

Disposed in the hardware processor 12 is a checkbyte/syndrome generator 14 having storage facilities for checkbytes or syndromes 16. Connected to the checkbyte/syndrome generator 14 is an external storage device 18 for storing syndrome information. Connected to syndrome storage device 18 is a correction vector generator 20. Correction vector generator 20 processes syndromes by using finite field arithmetic operations. Connected to correction vector generator 20 is a vector FIFO register 22 that functions as a queue.

Connected to hardware processor 12 is an interface 24 which is used to facilitate data transfer between hardware processor 12 and other components that access a communications bus, not shown. Interface 24 has a register file 26 therein, described in greater detail hereinbelow.

In summary, therefore, error processor 10 comprises the following major blocks:

a) Interface logic 24 having a register file 26 b) Checkbyte/syndrome generator 14 c) Syndrome store 18 d) Correction vector generator 20.

Interface 24 incorporates an 8-bit, parity-protected data bus along with the associated control signals for reading and writing register file 26 and for reading and writing checkbyte/syndrome generator 14. Error processor 10 supports a slave-type access for register file 26 and a fast access mechanism to access checkbyte/syndrome generator 14.

Register file 26 is used to program the operating parameters for error processor 10 and control the operation thereof.

Also, the top of the correction vector queue is mapped into one of the registers in register file 26 for access to the correction vector queue 22.

Checkbyte/syndrome generator 14, during disk write and read operations, generates the checkbytes or the syndromes, respectively, and contains a 160-byte checkbyte RAM store 16, which is accessed using the fast access mechanism. Syndrome store 18 holds the syndrome for correction vector generator 20. When an error is detected during a disk read operation, control logic transfers the non-zero syndromes from checkbyte/syndrome generator 14 to syndrome store 18 so that the following incoming sector data can be processed by checkbyte/syndrome generator 14.

Correction vector generator 20 generates the correction vectors in case a disk read error occurs. These vectors are placed in vector queue (FIFO) 22 and can be accessed by an external device to perform the correction on the sector data in the buffer.

Interface 24 communicates with a communications bus connected therewith by means of control signals, data lines and a parity line 34.

Figure 2:
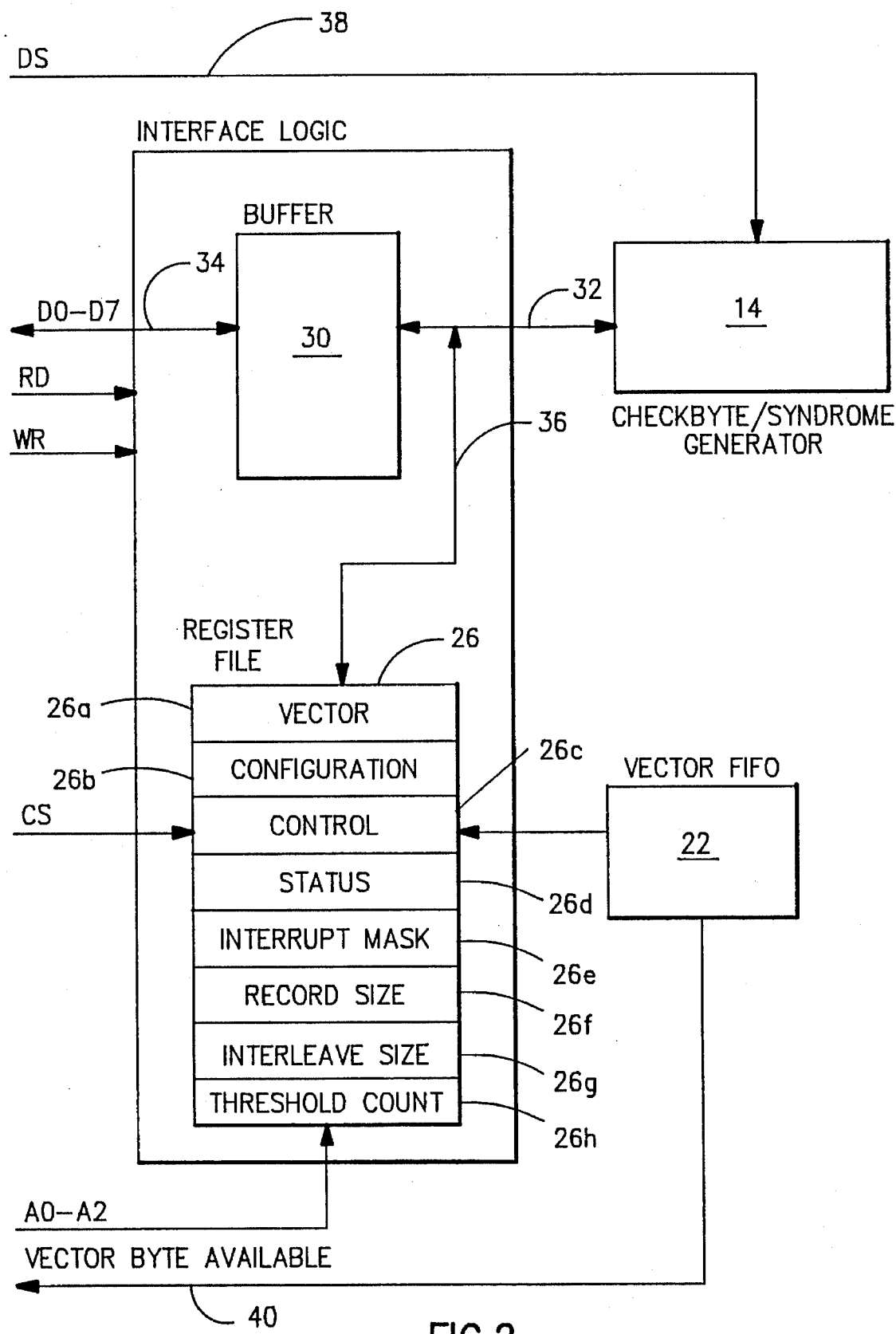
FIG. 2 is a block diagram of the error processor shown in FIG. 1 showing details of the interface.

Referring now also to FIG. 2, a block diagram shows interface 24 (FIG. 1).in greater detail. A buffer 30 is included in interface 24 for isolating an internal bus 32 which connects hardware processor 12 to interface 24 (FIG. 1) from an external bus 34 connected to a data communications bus, not shown. Moreover, an 8-bit line 36 connects register file 26 to internal bus 32.

A control signal DS 38 is applied to checkbyte/syndrome generator 14 for allowing high speed data transfers thereto. Address lines A0–A2 and a chip select (CS) line are applied to register file 26 for transmitting data from buffer 30 to selected registers 26a–26h in register file 26. Registers 26a–26h and their functions are disclosed in greater detail hereinbelow.

Vector FIFO register 22 generates a VECTOR BYTE AVAILABLE signal and transmits it to the data communications bus, not shown. VECTOR BYTE AVAILABLE, when asserted over line 40 and transmitted at a correspondingly named pin, not shown, indicates that one correction vector is available in correction vector queue 22 and can be fetched via register file 26 by an external device. VECTOR BYTE AVAILABLE is deactivated when the first byte of a three byte correction vector is fetched. If another correction vector becomes available in the meantime, VECTOR BYTE AVAILABLE pin will be activated again.

Error processor 10 always generates a three byte vector. The top four bits of the first byte of the vector indicate the status of the correction operation. If the status indicates a terminating status, such as an uncorrectable error or fault, the external device must read the next two bytes of the vector to reset the internal vector FIFO control logic. For the terminating case of an uncorrectable error or fault, error processor 10 generates a dummy vector in which the error value is guaranteed to be zero.

Internal registers 26a–26h are accessible via data buses 32 and 34. These registers 26a–26h allow the device to be configured and controlled in a variety of system configurations. Registers 26a–26h are also used to return device status and correction vectors and can perform test/diagnostic operations on the device.

Error processor register file 26 has the following user accessible registers:

Vector register 26a

Configuration register 26b

Control register 26c

Status register 26d

Interrupt mask register 26e

Record size register 26f

Interleave size register 26g

Threshold count register 26h

Vector register 26a provides access to the top of the multi-byte vector queue 26. Vector queue 26 is 24 bytes deep and can hold all the vectors for one subdivision at one time. A vector is a three byte packet that includes a 4-bit status, a 12-bit offset and an 8-bit error value. The status and offset information is packed into the first two bytes of the vector.

As error processor 10 finds errors during the correction process, it computes the offset and the value of the byte in error, placing this information in the vector queue 26 to be read and processed by external logic. VECTOR BYTE AVAILABLE pin is also activated as a vector is placed in the vector queue 26.

Vector register 26a is not read unless error processor 10 indicates the availability of a vector by activating the VECTOR BYTE AVAILABLE pin and setting the appropriate status bit in a status register, hereinbelow described.

Configuration register 26b is used to configure error processor 12 with information that includes the number of interleaves or subdivisions in the sector, interrupt control, CRC control and parity control.

Two bits specify the number of subdivisions in the sector to be processed. An interrupt enable bit is a global interrupt control. If this bit is set (1), error processor 10 generates interrupts. If this bit is reset (0), no interrupt is generated. Individual interrupts can be masked further by programming the interrupt mask register, discussed hereinbelow.

Control register 26c is used to control the operation of error processor 12 and the software reset function.

When a GO control bit in control register 26c is set (1), error processor 10 starts an operation as programmed in the operation control field described below. When this bit is reset (0), error processor 10 does not perform any operation. All register bits except the reset bit are written when the GO bit is reset (0).

An operation control field determines the operations performed by error processor 10 when the GO bit is set (1). This field is updated only when the GO bit is reset (0).

Error processor 10 can operate in one of the modes described below. Status is generated as the operation is performed. Interrupts are generated as programmed via an interrupt mask register, hereinbelow described.

The command codes used to place error processor 10 in a desired mode are GEN CB (disk write) and DET AND CORR (disk read).

During disk writes, error processor 10 is programmed in the generate checkbyte (GEN CB) mode. In this mode, error processor 10 generates checkbytes for data bytes from the bus. These checkbytes are to be conveyed to the bus. Status is reported as each disk sector is processed.

During disk reads, the error processor 10 is programmed to operate in detect and correct (DET AND CORR) mode. Error processor 10 transfers the generated syndromes to correction vector generation logic when it becomes free and proceeds to generate the correction vectors from it. If a sector overrun condition is caused by clocking in data stored in a new sector (say S2) when a previous sector (S1) is in syndrome generator 14 and another sector (S0) is in correction vector generator 20, error processor 10 signals a sector overrun condition. However, the data bytes of the offending sector (S2) are ignored and the previously generated syndromes are not lost.

A CRC operation control bit, when set (1), enables the CRC generation during disk write operation and the CRC detection during disk read operation. When this bit is reset (0), the CRC generation and detection circuit is disabled.

If the CRC logic is enabled, the four CRC bytes generated by this logic during disk write procedure are outputted for writing to the disk. They are also internally routed to checkbyte generator 14 for coverage by the error detection and correction (EDAC) field. During disk read operation, CRC is generated over the incoming data and CRC field. If no read error occurs in the data and the CRC field, the generated CRC is zero. If a non-zero CRC results, it is saved internally for later verification of the correction vectors generated.

Status register 26d indicates the status of error processor 10 as it performs an operation. Also, error processor 10 generates an interrupt if the interrupt enable bit is set and an interrupt mask register, described below, is programmed to generate an interrupt for that condition.

In general, error processor 10 reports three types of status:

1. During sector processing,
2. After sector processing, and
3. Fatal errors.

During sector processing, error processor 10 normally reports the status and continues processing. After sector processing, error processor 10 reports the status and continues processing for multi-sector operation. In case an uncorrectable error occurs in detect and correct mode, error processor 10 reports that error and the correction unit does not process the syndromes for that sector anymore. However, the detection logic continues processing; the syndrome for this sector is transferred and operated upon by the correction unit when it becomes available. Fatal errors cause error processor 10 to stop.

Interrupt mask register 26e is provided to tailor the interrupt generated by error processor 10 to suit system requirements. The interrupt enable bit in control register 26c must be set if error processor 10 is to generate any interrupt at all. These mask bits are provided to fine tune the interrupt structure.

For each condition reported in status register 26d, a corresponding bit is provided in interrupt mask register 26e that determine whether an interrupt will be generated by error processor 10.

If a bit is set in interrupt mask register 26e, the corresponding condition does not cause an interrupt to be generated by error processor 10. If a bit is reset, then an interrupt is generated by error processor 10 when that condition occurs if the interrupt enable bit in control register 26c is set.

Record size register 26f contains the total number of data and checkbytes. Normally, a CPU must write this value once after power-up.

Interleave size register 26g contains the length of one subdivision of a sector.

Threshold count register 26h specifies a count used by error processor 10 to alert a CPU in case the number of errors in a subdivision equals the programmed count. This information is useful in detecting how much of the error correction capability of the code is being used.

If the number of errors in any subdivision equals the programmed count, error processor 10 sets the corresponding status bit and the CPU is interrupted, if so programmed.

Figure 3:
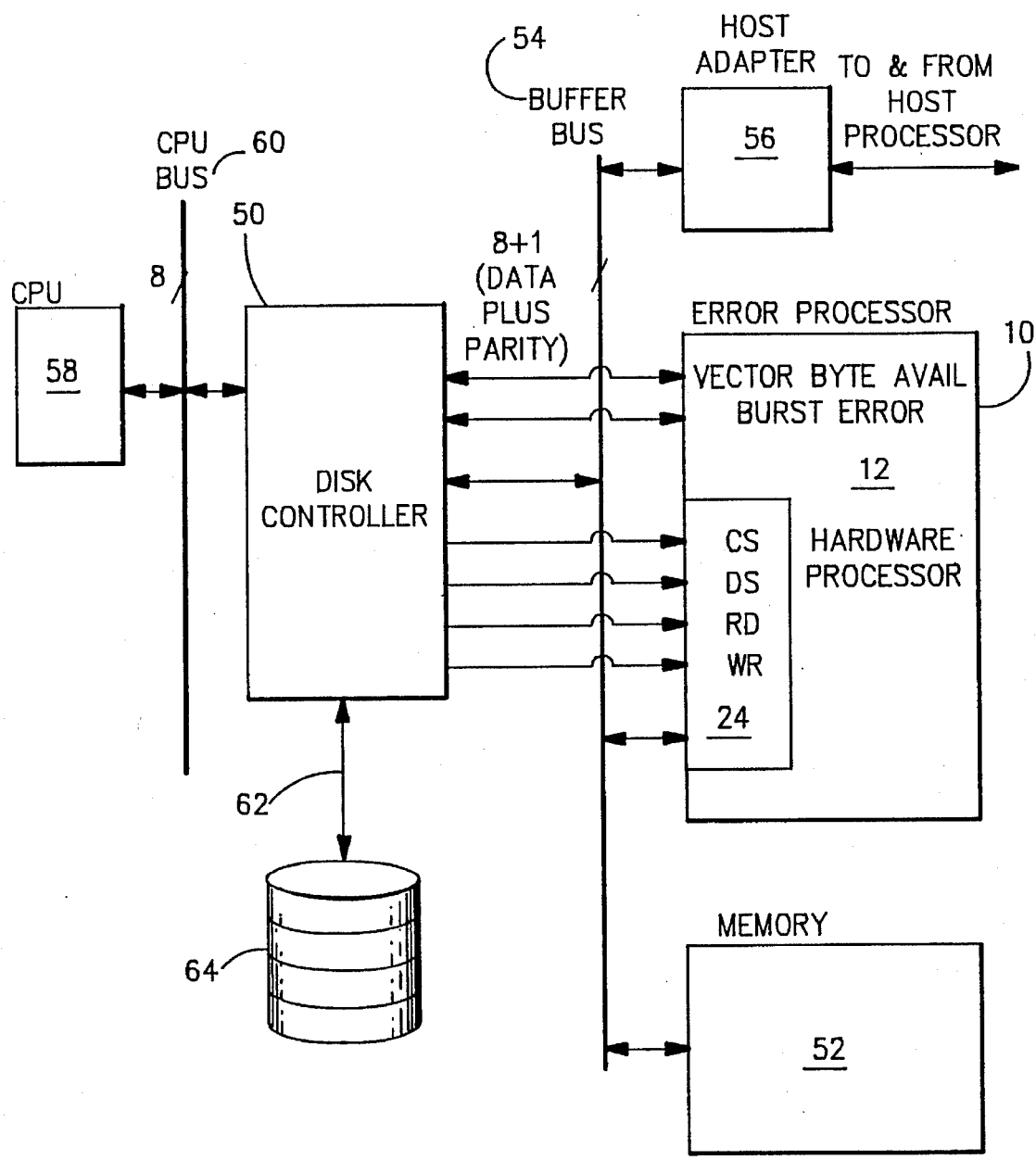
FIG. 3 is a block diagram showing implementation of the error processor in a disk controller environment.

Referring now also to FIG. 3, a block diagram shows the implementation of error processor 10 in accordance with the present invention in a disk controller environment, and specifically in an optical disk controller environment.

Error processor 10 consists of hardware processor portion 12 and interface 24, as described hereinabove. Connected to error processor 10 is a disk controller 50. A suitable disk controller for purposes of this invention is available from Advanced Micro Devices Inc. as model number Am95C96.

A memory device 52 is also connected to error processor 10 by means of a buffer bus 54. In the preferred embodiment, memory 52 is a 256 K byte DRAM.

Also connected to buffer bus 54 is a host adapter 56, such as manufactured by Advanced Micro Devices Inc. as model number Am33C93.

Connected to disk controller 50 also is a CPU 58 such as manufactured by Advanced Micro Devices Inc. as model number Am80C51. CPU 58 is connected to disk controller 50 by means of a CPU bus 60.

Connected to disk controller 50 by means of a serial data bus 62 are one or more disk drives 64, in which optical disks formatted into conventional sectors, not shown, reside.

After power-up or reset, error processor 10 is programmed by CPU 58 with appropriate operating parameters. During disk write operation, disk controller 50 transfers sector data bytes from buffer memory 52 to disk 64. As this transfer takes place, data path controller 50 also writes this data to error processor 10, which internally generates checkbytes for this data. After the sector data has been written to disk 64, disk controller 50 reads out the checkbytes from error processor 10 and writes them to disk 64.

During disk read operation, controller 50 transfers the sector data bytes from disk 64 to buffer memory 52 and error processor 10. Data is written simultaneously into buffer 52 and error processor 10. After the sector data has been read from disk 64, controller 50 reads out the checkbytes from disk 64 and writes them to error processor 10. Error processor 10 generates the syndromes for this data and checkbytes. If the generated syndrome is zero, disk sector read operation was successful. Otherwise, error processor 10 calculates correction vectors for this sector. At the same time, a new sector can be clocked into error processor 10 to maintain zero interleave read operation from disk 64.

Although error processor 10 performs the correction vector computation, the actual correction (i.e., computation of the bad byte address and fetch, XOR, and write-back of the byte) is performed by buffer manager logic controller 50 or in an external microprocessor unit.

When disk controller 50 is reading disk 64, it reads sector data from the disk and writes it to memory 52, activating the appropriate memory write control signal and error processor 10 (by activating DS and WR) simultaneously. The checkbytes read from disk 64 are written only to error processor 10 (by activating DS and WR). Error processor 10 maintains internal count of the sector data and EDAC field lengths.

During disk read operation, error processor 10 allows simultaneous syndrome generation and correction vector generation. Thus, while a new sector is being read into error processor 10 for syndrome generation, error processor 10 can compute correction vectors for a previously read sector, if an error was detected for that sector. Moreover, the correction vector(s) of another previously read sector can reside in vector FIFO register 22.

Figure 4:
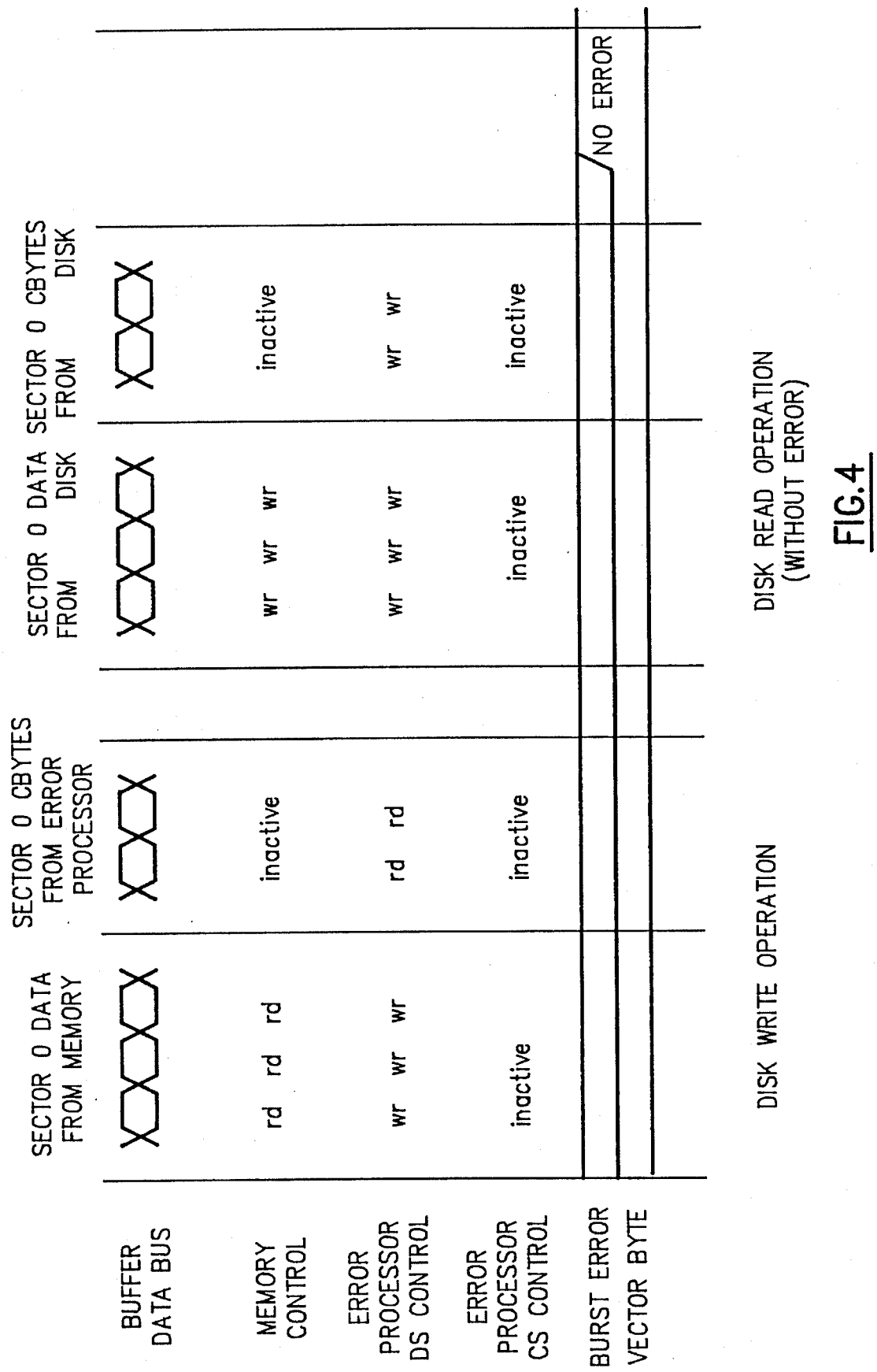
FIG. 4 is a timing diagram of data transmission and data reception operation.
Figure 5:
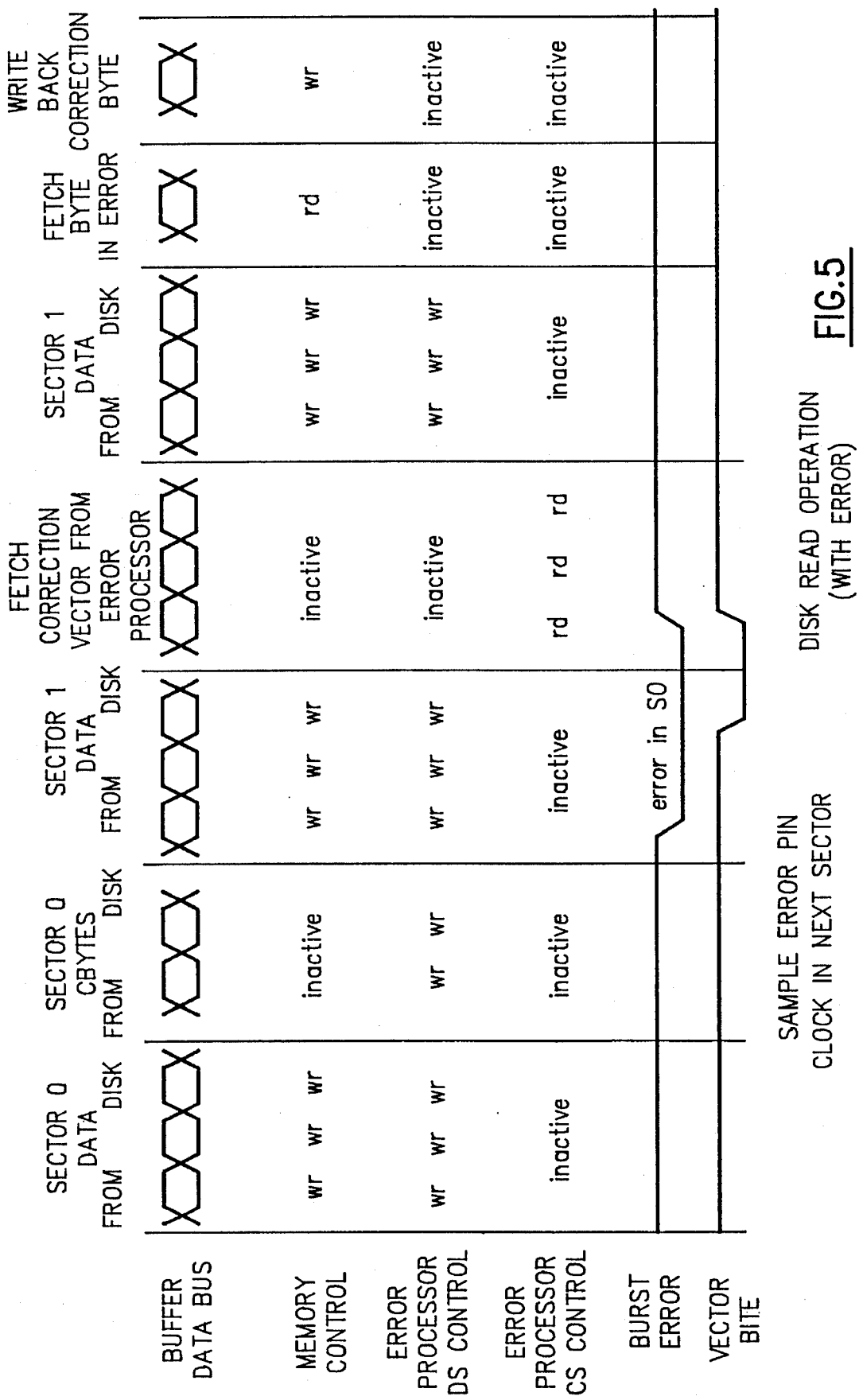
FIG. 5 is a timing diagram of data reception operation when an error occurs during the course thereof.

Referring now also to FIGS. 4 and 5, timing diagrams are shown that represent data write (transmit) and data read (receive) operation (FIG. 4) and data read operation when an error occurs during such a read operation (FIG. 5).

In operation, it is helpful to consider an example in which data from three sectors, namely S0, S1 and S2, are read from a disk. In general, a sector is read from disk 64 and the data for that sector is clocked into error processor 10 using control signals DS and WR. This data is also sent to memory 52 for storage. The checkbyte field read from the sector is sent only to error processor 10 using DS and WR control signals.

Data for sector S0 is clocked into syndrome generator 14 followed by the checkbyte for that sector. Assuming an error has occurred in the sector in issue, the syndrome for the sector is non-zero and is generated by generator 14. This condition is signaled to the controller 50 using a signal known as BURST ERROR.

Syndromes generated for sector S0 are now transferred into syndrome store 18 and syndrome generator 14 is ready to receive data and checkbytes for the next sector, S1. As data for the next sector S1 is clocked into syndrome generator 14, correction vector generator 20 begins to process the syndrome for sector Correction vectors generated by correction vector generator 20 are placed in vector FIFO 22. Availability of correction vectors is signaled to disk controller 50 using the VECTOR BYTE AVAILABLE signal. Disk controller 50 fetches these vector bytes from vector FIFO 22 using signals CS, RD and appropriate address control signals. Disk controller 50 then interprets these vectors and performs the necessary correction(s) on data stored in memory 52.

When the correction vector generation for data in sector S0 is complete, syndrome store 18 is again available for the next sector. By then, the syndrome generation for sector S1 may be complete and the syndrome for sector S1 (assuming it contains errors) is transferred to syndrome store 18. Syndrome generator 14 itself is available for processing data in sector S2. Consequently, at one time, vector FIFO 22 can contain vectors for sector S0, correction vector generator 20 can be processing data from sector S1 and syndrome generator can be processing data in sector S2.

At the end of each sector syndrome generation operation, error processor 10 signals the presence of an error in the corresponding sector using the BURST ERROR signal. But when data from a number of sectors is read from disk 64, it is possible that some sectors will not contain an error. If data in a sector does not contain an error, its syndrome is not sent to correction vector generator 20 for processing. Accordingly, the sector being processed by syndrome generator 14 and by correction vector generator 20, and the sector whose correction vectors are being held in vector FIFO 22 need not be sequential.

Since disk controller 50 is signaled at the end of each sector—regardless of whether that sector has an error—it can keep track of which sectors had errors. When it retrieves the correction vector from vector FIFO 22, it is signaled that this is the last correction vector for a sector. When the first correction vector of the next sector is read from vector FIFO 22, therefore, disk controller 50 can determine the sector that corresponds to this correction vector.

When data from a subsequent sector is read and checkbyte/syndrome generator 14 is processing data from a previous sector, and syndrome store 18 and correction vector generator 20 are occupied with data from a sector previous to that, and vector FIFO 22 contains correction vector information from still a more previous sector, data from the latest sector is ignored. All data and processing that occur in error processor 10 remain intact.

When the VECTOR BYTE AVAILABLE pin, not shown, becomes active, disk controller 50 performs the correction by fetching a three byte vector from the vector queue using CS, RD and appropriate address signals. Disk controller 50 computes the address of the byte-in-error in buffer 30 using the offset calculated by correction vector generator 20. Disk controller 50 then fetches this byte from buffer 30, XORs it with the error value and writes the corrected data back to buffer memory 30.

This process continues until all errors have been found and corrected or until error processor 10 indicates that the sector has an uncorrectable error. This status is returned to disk controller 50 in the correction vector itself.

Error processor 10 correction hardware cannot immediately discern if data in a sector is uncorrectable. The sector is first assumed to be correctable. As the correction vector computation proceeds, the correction vector generator 20 may determine that the sector is uncorrectable. This causes correction vector generator 20 to terminate the sector operation. Appropriate status is stored in status register 26d. Also, a final vector is generated with the appropriate status.

Since other modifications and changes varied to fit particular operating requirements and environments will be apparent to those skilled in the art, the invention is not considered limited to the example chosen for purposes of disclosure, and covers all changes and modifications which do not constitute departures from the true spirit and scope of this invention.

What is claimed is:

1. An error processor for providing hardware syndrome generation and analysis, said error processor being disposed on a single integrated circuit chip to detect errors in a block of received data and to generate an error correction vector, said error processor being in communicative relationship with an external communications bus and comprising:
   a) processing hardware means for:
      i) receiving data and for generating syndrome bytes corresponding to said received data,
      ii) detecting errors in said received data and for generating error correction vectors indicative of the relative locations of said errors and of the values thereof, and
      iii) generating checkbytes as a function of the received data; and
   b) interface means operatively connected to said processing hardware means and to said external communications bus for facilitating data transfer therebetween,
   further comprising dummy vector generating means for generating a predetermined dummy error value in an error correction vector upon occurrence of an uncorrectable error.

2. The error processor in accordance with claim 1 wherein said interface means comprises a high speed data transmission interface and a register interface.

3. An error processor as recited in claim 1, wherein said interface means further comprises:
   status indicating means for including in said error correction vectors a status indicator identifying a status of a correction operation.

4. An error processor for providing hardware syndrome generation and analysis, said error processor being disposed on a single integrated circuit chip to detect errors in a block of received data and to generate an error correction vector, said error processor being in communicative relationship with an external communications bus and comprising:
   a) processing hardware means for:
      i) receiving data and for generating syndrome bytes corresponding to said received data,
      ii) detecting errors in said received data and for generating error correction vectors indicative of the relative locations of said errors and of the values thereof, and
      iii) generating checkbytes as a function of the received data; and
   b) interface means operatively connected to said processing hardware means and to said external communications bus for facilitating data transfer therebetween, wherein said interface means further comprises;

status indicating means for including in said error correction vectors a status indicator identifying a status of a correction operation, dummy vector generating means for generating a predetermined dummy error value in an error correction vector when said status indicator thereof identifies an uncorrectable error.

5. An error processor for providing hardware syndrome generation and analysis, Said error processor being disposed on a single integrated circuit chip to detect errors in a block of received data and to generate an error correction vector, said error processor being in communicative relationship with an external communications bus and comprising:

a) processing hardware means for:
   i) receiving data and for generating syndrome bytes corresponding to said received data,
   ii) detecting errors in said received data and for generating error correction vectors indicative of the relative locations of said errors and of the values thereof, and
   iii) generating checkbytes as a function of the received data; and b) interface means operatively connected to said processing hardware means and to said external communications bus for facilitating data transfer therebetween, wherein said processing hardware means comprises a vector FIFO register for accepting said error correction vectors generated by said processing hardware means.

6. The error processor in accordance with claim 5, wherein said interface means comprises a record size register for specifying the length of said block of received data.

7. The error processor in accordance with claim 5, wherein said interface means comprises a threshold count register for specifying a maximum allowable number of errors to be corrected by an external error correcting means.

8. An error processor as recited in claim 5, wherein said vector FIFO register is internal to said error processor, and said error processor further comprises:

means for indicating a status of a correction operation, for identifying an error location, and for determining an error value;

means for including said status of a correction operation, said error location, and said error value in said error correction vector; and means for generating a dummy vector when said status of a correction operation indicates a terminating status, said error processor connected via said external communications bus to an external control means;

said means for including thereby providing to said control means in the dummy vector an indication of uncorrectable error status when an uncorrectable error occurs thus enabling said control means to reset control logic of said vector FIFO register.

9. The error processor in accordance with claim 5, wherein said interface means comprises a register file adapted to retrieve error correction vector data from said vector FIFO register.

10. The error processor in accordance with claim 9, wherein said interface means is adapted to generate a VECTOR BYTE AVAILABLE signal to indicate availability of an error correction vector.

11. The error processor in accordance with claim 5, wherein said interface means comprises a configuration register for specifying a number of subdivisions in said block of received data.

12. The error processor in accordance with claim 11, wherein said interface means further comprises an interleave size register for specifying the length of each of said subdivisions.

13. The error processor in accordance with claim 5, wherein said interface means comprises a status register for indicating completion of tasks and for indicating occurrence of uncorrectable errors.

14. The error processor in accordance with claim 13, wherein said interface means further comprises an interrupt mask register for selectively inhibiting generation of an interrupt signal when said status register is updated.

15. The error processor in accordance with claim 5, wherein said interface means comprises a control register for controlling operation of said processing hardware means.

16. The error processor in accordance with claim 15, wherein predetermined bits stored in said control register determine whether a data transmission (write) or a data reception (read) operation is to be performed.

17. The error processor in accordance with claim 15, wherein predetermined bits stored in said control register enable operation of said processing hardware means.

18. An error correcting system, comprising an error processor for providing hardware syndrome generation and analysis, said error processor being disposed on a single integrated circuit chip to detect errors in a block of received data and to generate an error correction vector, said error processor being in communicative relationship with a communications bus and including:

a) processing hardware means for:
   i) receiving data and for generating syndrome bytes corresponding to said received data,
   ii) detecting errors in said received data and for generating error correction vectors indicative of the relative locations of said errors and of the values thereof, and
   iii) generating checkbytes as a function of the received data; and b) interface means operatively connected to said processing hardware means and to said communications bus for facilitating data transfer therebetween, said communications bus further connected to a control means for controlling communication among a plurality of data sources;

said control means correcting errors in data transmitted from one of the data sources to another of the data sources, c) said processing hardware means further comprising queue means for storing said error correction vectors and signal means for outputting a VECTOR BYTE AVAILABLE signal to said control means for informing said control means of availability of one of said error correction vectors thereby eliminating a requirement for polling or interrupts, d) said control means being responsive to said VECTOR BYTE AVAILABLE signal by correcting an error identified by an error correction vector in said queue means.

19. An error correcting system as recited in claim 18, wherein said error processor further comprises:

an internal vector FIFO register for accepting said error correction vectors generated by said processing hardware means;

means for indicating a status of a correction operation, for identifying an error location, and for determining an error value;

means for including said status of a correction operation, said error location, and said error value in said error correction vector; and means for generating a dummy vector when said status of a correction operation indicates a terminating status, said control means being external to said error processor;

said means for including thereby providing to said control means in the dummy vector an indication of uncorrectable error status when an uncorrectable error occurs thus enabling said control means to reset control logic of said internal vector FIFO responsively thereto.

20. An error correcting system as recited in claim 18, wherein said interface means further comprises:

status indicating means for including in said error correction vectors a status indicator identifying a status of a correction operation.

21. An error correcting system as recited in claim 18, wherein:

said control means being external to said error processor, and said interface means comprises dummy vector generating means for generating a predetermined dummy error value in an error correction vector upon occurrence of an uncorrectable error, said dummy error value in said error correction vector providing to said control means an indication of uncorrectable error status when an uncorrectable error occurs in a block of received data.

22. An error correcting system as recited in claim 18 wherein said control means is responsive to assertion of said VECTOR BYTE AVAILABLE signal by:

a) fetching an error correction vector from said queue means;

b) computing a location of a byte having an error;

c) fetching the byte having the error;

d) correcting the error in accordance with data provided in said error correction vector; and e) replacing the byte with the corrected error.

23. An error correcting system as recited in claim 17 wherein said control means comprises disk controller means for controlling transfer of data sectors between a disk and a storage device, said interface means comprises buffer means for storage of data being transferred, and said error processor comprises means for including data in said error correction vector for indicating relative locations of errors;

said disk controller means operable for computing a location in said buffer means of a byte having an error in accordance with the data provided in said error correction vector, fetching the byte from said location in said buffer means for correction of the error, and restoring the corrected byte to said location in said buffer means.

24. An error correcting system as recited in claim 23 wherein said processing hardware means further comprises means for simultaneously:

i) processing data for a first data sector to generate a syndrome therefor, ii) processing a syndrome generated for a second data sector preceding said first data sector to generate an error correction vector for said second data sector; and iii) storing an error correction vector generated for a third data sector preceding said second data sector.

25. An error processor for providing hardware syndrome generation and analysis, said error processor being disposed on a single integrated circuit chip to detect errors in a sequence of blocks of received data and to generate an error correction vector, said error processor being in communicative relationship with an external communications bus and comprising:

a) processing hardware means for:

i) receiving data and for generating syndrome bytes corresponding to said received data, ii) detecting errors in said received data and for generating error correction vectors indicative of the relative locations of said errors and of the values thereof, and iii) generating checkbytes as a function of the received data; and b) interface means operatively connected to said processing hardware means and to said external communications bus for facilitating data transfer therebetween, c) said processing hardware means comprising: means for simultaneously:

i) processing data for a first data block to generate a syndrome therefor, ii) processing a syndrome generated for a second data block preceding said first data block to generate an error correction vector for said second data block; and iii) storing an error correction vector generated for a third data block preceding said second data block, and means for generating a VECTOR BYTE AVAILABLE signal to inform an external communications controller of availability of an error correction vector thus eliminating a requirement for polling or interrupts.

26. An error processor as recited in claim 25 further comprising an external control means connected to said external communications bus, said external control means operating for controlling data transfer among a plurality of data sources; and wherein said interface means comprises register means for storing control information for said error correction vectors and buffer means for storage of data being transferred;

said error processor further comprising means for including data in said error correction vector for indicating relative locations in said buffer means of bytes having errors; and wherein said control means is operable in response to said VECTOR BYTE AVAILABLE signal for fetching an error correction vector from said queue means; computing a location in said buffer means of a byte having an error in accordance with the data provided in said error correction vector; fetching the byte from said location in said buffer means for correction of the error; and restoring the corrected byte to said location in said buffer means.

27. An error processor as recited in claim 25, wherein said error processor further comprises:

means for indicating a status of a correction operation, for identifying an error location, and for determining an error value;

means for including said status of a correction operation, said error location, and said error value in said error correction vector; and means for generating a dummy vector when said status of a correction operation indicates a terminating status, thereby to provide to said external communications controller in the dummy vector an indication of uncorrectable error status error occurs.

28. An error processor as recited in claim 25 further comprising status indicating means for including in said error correction vectors a status indicator identifying a status of a correction operation.

29. An error processor as recited in claim 25, further comprising dummy vector generating means for generating a predetermined dummy error value in an error correction vector when said status indicator thereof identifies an uncorrectable error, thereby providing to said external control means an indication of uncorrectable error status when an uncorrectable error occurs in a block of received data.

* * * * *